United States Patent
Jairazbhoy et al.

(10) Patent No.: US 6,303,872 B1
(45) Date of Patent: *Oct. 16, 2001

(54) ANTI-TOMBSTONING SOLDER JOINTS

(75) Inventors: Vivek Amir Jairazbhoy, Farmington Hills; Richard Keith McMillan, II, Dearborn, both of MI (US)

(73) Assignee: Visteon Global Tech., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/882,482

(22) Filed: Jun. 25, 1997

(51) Int. Cl.$^7$ ........................................ H01R 9/09
(52) U.S. Cl. ..................... 174/260; 174/261; 361/760; 361/767
(58) Field of Search ...................... 174/260, 261; 361/760, 767, 768

(56) References Cited

U.S. PATENT DOCUMENTS

| | | | |
|---|---|---|---|
| 4,926,151 | 5/1990 | Morinaga | 335/296 |
| 4,928,387 | 5/1990 | Mather et al. | 29/840 |
| 4,959,505 | 9/1990 | Ott | 174/52.2 |
| 5,012,388 | 4/1991 | Kabeshita et al. | 361/783 |
| 5,311,405 | 5/1994 | Tribbey et al. | 361/767 |
| 5,442,852 | 8/1995 | Danner | 29/843 |
| 5,468,919 | 11/1995 | Shiozaki et al. | 174/261 |
| 5,504,277 | 4/1996 | Danner | 174/261 |
| 5,508,562 | 4/1996 | Horie et al. | 257/772 |
| 5,569,880 | 10/1996 | Galvagni et al. | 174/52.4 |

FOREIGN PATENT DOCUMENTS 2-54989 * 2/1990 (JP) .
6-21604 * 1/1994 (JP) .

* cited by examiner

Primary Examiner—Albert W. Paladini
(74) Attorney, Agent, or Firm—Visteon Global Tech.

(57) ABSTRACT

An electronic circuit assembly having anti-tombstoning solder joints, including: a substrate 10 having at least one mounting pad 20 thereon; an SMD 30 having at least one termination 40; and at least one solder joint 50 connecting each termination 40 to its respective mounting pad 20. Each solder joint 50 is convex in shape, having a continuous and substantially circular arcuate outer profile 60 and covering substantially all of the mounting pad 20 and substantially all of a top portion 42 of each termination 40. Each mounting pad 20 has a predetermined length $l_p$ and each solder joint has a predetermined volume of solder selected such that a positive net anti-tombstoning moment is exerted upon the SMD 30 when at least one solder joint 50 is in a molten state.

32 Claims, 4 Drawing Sheets

Type of Device ........................................ 0603 chip resistor
Number of Terminations ........................ ............... 2 (opposing)
Weight of SMD ........................... W .................. 1 mg
Weight lever arm ---------- ................ d ................ 30 mils
Stand-off height ........_____ ................ h .................... 1 mil
Side termination height................... $H_o$ ................ 14 mils
Top/Bottom term. length.................. $l_m$ ................ 10 mils
Surface Tension ....................................... $\sigma$ ............ 0.49 N/m
Solder Joint Width .............................. w ................ 30 mils
3-D correction factor ........................... K .................... 2
Selected Range for $l_o$........,.................... $l_o$ ........... 6 - 14 mils Solder deposition method ..................... Screenprinting
Deposition thickness ........ ................. T ................ 10 mils
% Solder in Paste ........................... $S_\%$ ................ 52 %
Max. Overprint -- length ..................... $O_L$ ................... 8 mils
Max. Overprint -- 2 sides ................. $O_S$ ................... 8 mils NOTE: ❖ signifies both $\Sigma M_G \geq 0$ and V ≤ Max. Paste

| $l_o$ (mils) | R (mils) | A (mil²) | V (mil³) | $\theta_3$ (deg) | $l_i$ (mils) | $l_p$ (mils) | $\Sigma M_G$ (N-mils) | Max. Paste (mil²) | Notes | |
|---|---|---|---|---|---|---|---|---|---|---|
| 6 | 10.97 | 168.89 | 5066.6 | #NUM! | #NUM! | #NUM! | #NUM! | 4742.4 | <-- $R_{semi}$ | |
| 6 | 11.0 | 151.03 | 4531.0 | #NUM! | #NUM! | #NUM! | #NUM! | 4742.4 | | |
| 6 | 11.2 | 126.36 | 3790.9 | #NUM! | #NUM! | #NUM! | #NUM! | 4742.4 | | |
| 6 | 11.4 | 113.99 | 3419.7 | 10.00 | 0.98 | 16.98 | -1.25 | 4742.4 | | |
| 6 | 11.6 | 105.19 | 3155.6 | 22.20 | 0.93 | 16.93 | -0.33 | 4742.4 | | |
| 6 | 11.8 | 98.26 | 2947.9 | 29.00 | 0.87 | 16.87 | 0.14 | 4742.4 | <-- $R_{min}$ | ❖ |
| 7 | 11.34 | 189.35 | 5680.4 | #NUM! | #NUM! | #NUM! | #NUM! | 4940.0 | <-- $R_{semi}$ | |
| 7 | 11.4 | 164.14 | 4924.3 | #NUM! | #NUM! | #NUM! | #NUM! | 4940.0 | | |
| 7 | 11.6 | 142.19 | 4265.6 | #NUM! | #NUM! | #NUM! | #NUM! | 4940.0 | | |
| 7 | 11.8 | 129.88 | 3896.5 | 20.64 | 0.94 | 17.94 | -0.60 | 4940.0 | | |
| 7 | 12.0 | 120.93 | 3627.9 | 28.48 | 0.88 | 17.88 | -0.07 | 4940.0 | | |
| 7 | 12.2 | 113.81 | 3414.4 | 33.97 | 0.83 | 17.83 | 0.27 | 4940.0 | | ❖ |
| 7 | 12.4 | 107.88 | 3236.5 | 38.30 | 0.78 | 17.78 | 0.52 | 4940.0 | <-- $R_{min}$ | ❖ |
| 8 | 11.72 | 210.59 | 6317.8 | #NUM! | #NUM! | #NUM! | #NUM! | 5137.6 | <-- $R_{semi}$ | |
| 8 | 11.9 | 168.00 | 5040.0 | 1.50 | 1.00 | 19.00 | -2.20 | 5137.6 | | |
| 8 | 12.0 | 159.33 | 4779.9 | 16.53 | 0.96 | 18.96 | -1.01 | 5137.6 | | |
| 8 | 12.2 | 146.82 | 4404.6 | 26.85 | 0.89 | 18.89 | -0.31 | 5137.6 | | |
| 8 | 12.4 | 137.59 | 4127.7 | 33.18 | 0.84 | 18.84 | 0.07 | 5137.6 | | ❖ |
| 8 | 12.6 | 130.20 | 3906.0 | 37.94 | 0.79 | 18.79 | 0.33 | 5137.6 | | ❖ |
| 8 | 12.8 | 124.01 | 3720.4 | 41.82 | 0.75 | 18.75 | 0.53 | 5137.6 | | ❖ |
| 8 | 13.0 | 118.69 | 3560.6 | 45.13 | 0.71 | 18.71 | 0.69 | 5137.6 | | ❖ |
| 8 | 13.2 | 114.01 | 3420.3 | 48.03 | 0.67 | 18.67 | 0.82 | 5137.6 | <-- $R_{min}$ | ❖ |
| 9 | 12.10 | 232.62 | 6978.6 | #NUM! | #NUM! | #NUM! | #NUM! | 5335.2 | <-- $R_{semi}$ | |
| 9 | 12.2 | 199.07 | 5972.1 | #NUM! | #NUM! | #NUM! | #NUM! | 5335.2 | | |
| 9 | 12.4 | 177.73 | 5332.0 | 23.34 | 0.92 | 19.92 | -0.64 | 5335.2 | | |
| 9 | 12.6 | 164.79 | 4943.8 | 31.43 | 0.85 | 19.85 | -0.15 | 5335.2 | | |
| 9 | 12.8 | 155.17 | 4655.1 | 36.93 | 0.80 | 19.80 | 0.14 | 5335.2 | | ❖ |
| 9 | 13.0 | 147.43 | 4422.9 | 41.23 | 0.75 | 19.75 | 0.35 | 5335.2 | | ❖ |
| 9 | 13.2 | 140.93 | 4228.0 | 44.80 | 0.71 | 19.71 | 0.52 | 5335.2 | | ❖ |
| 9 | 13.4 | 135.33 | 4059.8 | 47.88 | 0.67 | 19.67 | 0.65 | 5335.2 | | ❖ |
| 9 | 13.6 | 130.39 | 3911.8 | 50.60 | 0.63 | 19.63 | 0.76 | 5335.2 | | ❖ |
| 9 | 13.8 | 125.99 | 3779.7 | 53.04 | 0.60 | 19.60 | 0.85 | 5335.2 | | ❖ |
| 9 | 14.0 | 122.02 | 3660.5 | 55.26 | 0.57 | 19.57 | 0.93 | 5335.2 | <-- $R_{min}$ | ❖ |
| 10 | 12.50 | 255.44 | 7663.1 | #NUM! | #NUM! | #NUM! | #NUM! | 5532.8 | <-- $R_{semi}$ | |
| 10 | 12.6 | 219.56 | 6586.8 | 13.87 | 0.97 | 20.97 | -1.35 | 5532.8 | | |
| 10 | 12.8 | 197.38 | 5921.4 | 28.05 | 0.88 | 20.88 | -0.44 | 5532.8 | | |
| 10 | 13.0 | 183.81 | 5514.2 | 35.04 | 0.82 | 20.82 | -0.06 | 5532.8 | | |
| 10 | 13.2 | 173.68 | 5210.4 | 40.03 | 0.77 | 20.77 | 0.18 | 5532.8 | | ❖ |
| 10 | 13.4 | 165.52 | 4965.5 | 44.01 | 0.72 | 20.72 | 0.35 | 5532.8 | | ❖ |
| 10 | 13.6 | 158.66 | 4759.7 | 47.35 | 0.68 | 20.68 | 0.49 | 5532.8 | | ❖ |
| 10 | 13.8 | 152.73 | 4581.8 | 50.26 | 0.64 | 20.64 | 0.60 | 5532.8 | | ❖ |
| 10 | 14.0 | 147.51 | 4425.2 | 52.84 | 0.60 | 20.60 | 0.69 | 5532.8 | | ❖ |
| 10 | 14.2 | 142.84 | 4285.2 | 55.17 | 0.57 | 20.57 | 0.77 | 5532.8 | | ❖ |
| 10 | 14.4 | 138.63 | 4158.8 | 57.29 | 0.54 | 20.54 | 0.83 | 5532.8 | | ❖ |
| 10 | 14.6 | 134.79 | 4043.6 | 59.25 | 0.51 | 20.51 | 0.89 | 5532.8 | | ❖ |
| 10 | 14.8 | 131.26 | 3937.9 | 61.06 | 0.48 | 20.48 | 0.94 | 5532.8 | | ❖ |
| 10 | 15.0 | 128.01 | 3840.2 | 62.76 | 0.46 | 20.46 | 0.98 | 5532.8 | <-- $R_{min}$ | ❖ |
| 11 | 12.90 | 279.04 | 8371.1 | #NUM! | #NUM! | #NUM! | #NUM! | 5730.4 | <-- $R_{semi}$ | |
| 11 | 13.0 | 241.96 | 7258.7 | 20.03 | 0.94 | 21.94 | -0.97 | 5730.4 | | |
| 11 | 13.2 | 218.30 | 6548.9 | 31.66 | 0.85 | 21.85 | -0.31 | 5730.4 | | |
| 11 | 13.4 | 203.89 | 6116.6 | 38.00 | 0.79 | 21.79 | 0.00 | 5730.4 | | |
| 11 | 13.6 | 193.14 | 5794.3 | 42.64 | 0.74 | 21.74 | 0.19 | 5730.4 | | |
| 11 | 13.8 | 184.48 | 5534.5 | 46.39 | 0.69 | 21.69 | 0.34 | 5730.4 | | ❖ |
| 11 | 14.0 | 177.20 | 5316.1 | 49.56 | 0.65 | 21.65 | 0.45 | 5730.4 | | ❖ |
| 11 | 14.2 | 170.91 | 5127.3 | 52.34 | 0.61 | 21.61 | 0.54 | 5730.4 | | ❖ |
| 11 | 14.4 | 165.36 | 4960.9 | 54.81 | 0.58 | 21.58 | 0.62 | 5730.4 | | ❖ |
| 11 | 14.6 | 160.41 | 4812.2 | 57.05 | 0.54 | 21.54 | 0.68 | 5730.4 | | ❖ |
| 11 | 14.8 | 155.93 | 4677.9 | 59.09 | 0.51 | 21.51 | 0.73 | 5730.4 | | ❖ |
| 11 | 15.0 | 151.85 | 4555.4 | 60.98 | 0.49 | 21.49 | 0.78 | 5730.4 | | ❖ |
| 11 | 15.2 | 148.10 | 4442.9 | 62.74 | 0.46 | 21.46 | 0.82 | 5730.4 | | ❖ |
| 11 | 15.4 | 144.63 | 4338.9 | 64.38 | 0.43 | 21.43 | 0.86 | 5730.4 | | ❖ |
| 11 | 15.6 | 141.41 | 4242.3 | 65.92 | 0.41 | 21.41 | 0.89 | 5730.4 | | ❖ |
| 11 | 15.8 | 138.41 | 4152.2 | 67.37 | 0.38 | 21.38 | 0.92 | 5730.4 | | ❖ |
| 11 | 16.0 | 135.59 | 4067.8 | 68.74 | 0.36 | 21.36 | 0.94 | 5730.4 | <-- $R_{min}$ | ❖ |

FIG. 5A

| $I_o$ (mils) | R (mils) | A (mil²) | V (mil³) | $\theta_3$ (deg) | $I_i$ (mils) | $I_p$ (mils) | $\Sigma M_G$ (N-mils) | Max. Paste (mil³) | Notes |
|---|---|---|---|---|---|---|---|---|---|
| 12 | 13.31 | 303.42 | 9102.7 | #NUM! | #NUM! | #NUM! | #NUM! | 5928.0 | <-- $R_{sem}$ |
| 12 | 13.4 | 266.41 | 7992.2 | 23.97 | 0.91 | 22.91 | -0.76 | 5928.0 | |
| 12 | 13.6 | 240.54 | 7216.1 | 34.52 | 0.82 | 22.82 | -0.22 | 5928.0 | |
| 12 | 13.8 | 225.07 | 6752.2 | 40.46 | 0.76 | 22.76 | 0.03 | 5928.0 | |
| 12 | 14.0 | 213.59 | 6407.8 | 44.87 | 0.71 | 22.71 | 0.19 | 5928.0 | |
| 12 | 14.2 | 204.36 | 6130.8 | 48.44 | 0.66 | 22.66 | 0.31 | 5928.0 | |
| 12 | 14.4 | 196.60 | 5898.0 | 51.49 | 0.62 | 22.62 | 0.41 | 5928.0 | ❖ |
| 12 | 14.6 | 189.90 | 5696.9 | 54.16 | 0.59 | 22.59 | 0.48 | 5928.0 | ❖ |
| 12 | 14.8 | 183.99 | 5519.7 | 56.55 | 0.55 | 22.55 | 0.54 | 5928.0 | ❖ |
| 12 | 15.0 | 178.71 | 5361.3 | 58.71 | 0.52 | 22.52 | 0.60 | 5928.0 | ❖ |
| 12 | 15.2 | 173.94 | 5218.2 | 60.69 | 0.49 | 22.49 | 0.64 | 5928.0 | ❖ |
| 12 | 15.4 | 169.59 | 5087.7 | 62.53 | 0.46 | 22.46 | 0.68 | 5928.0 | ❖ |
| 12 | 15.6 | 165.59 | 4967.8 | 64.23 | 0.43 | 22.43 | 0.71 | 5928.0 | ❖ |
| 12 | 15.8 | 161.90 | 4857.0 | 65.83 | 0.41 | 22.41 | 0.74 | 5928.0 | ❖ |
| 12 | 16.0 | 158.47 | 4754.1 | 67.33 | 0.39 | 22.39 | 0.77 | 5928.0 | ❖ |
| 12 | 16.2 | 155.27 | 4658.1 | 68.74 | 0.36 | 22.36 | 0.79 | 5928.0 | ❖ |
| 12 | 16.4 | 152.27 | 4568.1 | 70.08 | 0.34 | 22.34 | 0.81 | 5928.0 | ❖ |
| 12 | 16.6 | 149.45 | 4483.5 | 71.35 | 0.32 | 22.32 | 0.83 | 5928.0 | <-- $R_{min}$ ❖ |
| 13 | 13.73 | 328.60 | 9857.9 | 10.49 | 0.98 | 23.98 | -1.61 | 6125.6 | <-- $R_{sem}$ |
| 13 | 13.8 | 293.27 | 8798.0 | 26.66 | 0.89 | 23.89 | -0.63 | 6125.6 | |
| 13 | 14.0 | 264.19 | 7925.6 | 36.83 | 0.80 | 23.80 | -0.17 | 6125.6 | |
| 13 | 14.2 | 247.42 | 7422.5 | 42.53 | 0.74 | 23.74 | 0.05 | 6125.6 | |
| 13 | 14.4 | 235.07 | 7052.1 | 46.77 | 0.68 | 23.68 | 0.18 | 6125.6 | |
| 13 | 14.6 | 225.17 | 6755.2 | 50.23 | 0.64 | 23.64 | 0.28 | 6125.6 | |
| 13 | 14.8 | 216.87 | 6506.2 | 53.17 | 0.60 | 23.60 | 0.36 | 6125.6 | |
| 13 | 15.0 | 209.71 | 6291.3 | 55.76 | 0.56 | 23.56 | 0.42 | 6125.6 | |
| 13 | 15.2 | 203.40 | 6102.1 | 58.08 | 0.53 | 23.53 | 0.47 | 6125.6 | ❖ |
| 13 | 15.4 | 197.77 | 5933.1 | 60.18 | 0.50 | 23.50 | 0.52 | 6125.6 | ❖ |
| 13 | 15.6 | 192.68 | 5780.4 | 62.12 | 0.47 | 23.47 | 0.55 | 6125.6 | ❖ |
| 13 | 15.8 | 188.04 | 5641.2 | 63.90 | 0.44 | 23.44 | 0.58 | 6125.6 | ❖ |
| 13 | 16.0 | 183.78 | 5513.3 | 65.57 | 0.41 | 23.41 | 0.61 | 6125.6 | ❖ |
| 13 | 16.2 | 179.84 | 5395.1 | 67.12 | 0.39 | 23.39 | 0.63 | 6125.6 | ❖ |
| 13 | 16.4 | 176.18 | 5285.3 | 68.59 | 0.37 | 23.37 | 0.65 | 6125.6 | ❖ |
| 13 | 16.6 | 172.76 | 5182.8 | 69.97 | 0.34 | 23.34 | 0.67 | 6125.6 | ❖ |
| 13 | 16.8 | 169.56 | 5086.8 | 71.29 | 0.32 | 23.32 | 0.68 | 6125.6 | ❖ |
| 13 | 17.0 | 166.55 | 4996.6 | 72.53 | 0.30 | 23.30 | 0.69 | 6125.6 | ❖ |
| 13 | 17.2 | 163.71 | 4911.4 | 73.72 | 0.28 | 23.28 | 0.71 | 6125.6 | ❖ |
| 13 | 17.4 | 161.03 | 4830.9 | 74.85 | 0.26 | 23.26 | 0.72 | 6125.6 | ❖ |
| 13 | 17.6 | 158.49 | 4754.6 | 75.94 | 0.24 | 23.24 | 0.72 | 6125.6 | ❖ |
| 13 | 17.8 | 156.07 | 4682.1 | 76.98 | 0.23 | 23.23 | 0.73 | 6125.6 | ❖ |
| 13 | 18.0 | 153.77 | 4613.1 | 77.98 | 0.21 | 23.21 | 0.74 | 6125.6 | <-- $R_{min}$ ❖ |
| 14 | 14.15 | 354.55 | 10636.6 | 17.45 | 0.95 | 24.95 | -1.12 | 6323.2 | <-- $R_{sem}$ |
| 14 | 14.2 | 323.29 | 9698.7 | 28.32 | 0.88 | 24.88 | -0.55 | 6323.2 | |
| 14 | 14.4 | 289.37 | 8681.0 | 38.70 | 0.78 | 24.78 | -0.13 | 6323.2 | |
| 14 | 14.6 | 270.98 | 8129.5 | 44.28 | 0.72 | 24.72 | 0.05 | 6323.2 | |
| 14 | 14.8 | 257.62 | 7728.5 | 48.41 | 0.66 | 24.66 | 0.17 | 6323.2 | |
| 14 | 15.0 | 246.96 | 7408.9 | 51.78 | 0.62 | 24.62 | 0.25 | 6323.2 | |
| 14 | 15.2 | 238.06 | 7141.7 | 54.65 | 0.58 | 24.58 | 0.32 | 6323.2 | |
| 14 | 15.4 | 230.38 | 6911.5 | 57.17 | 0.54 | 24.54 | 0.37 | 6323.2 | |
| 14 | 15.6 | 223.64 | 6709.1 | 59.44 | 0.51 | 24.51 | 0.41 | 6323.2 | |
| 14 | 15.8 | 217.61 | 6528.4 | 61.49 | 0.48 | 24.48 | 0.44 | 6323.2 | |
| 14 | 16.0 | 212.17 | 6365.2 | 63.38 | 0.45 | 24.45 | 0.47 | 6323.2 | |
| 14 | 16.2 | 207.22 | 6216.5 | 65.13 | 0.42 | 24.42 | 0.49 | 6323.2 | ❖ |
| 14 | 16.4 | 202.66 | 6079.9 | 66.76 | 0.39 | 24.39 | 0.51 | 6323.2 | ❖ |
| 14 | 16.6 | 198.46 | 5953.7 | 68.29 | 0.37 | 24.37 | 0.53 | 6323.2 | ❖ |
| 14 | 16.8 | 194.55 | 5836.5 | 69.73 | 0.35 | 24.35 | 0.54 | 6323.2 | ❖ |
| 14 | 17.0 | 190.90 | 5727.1 | 71.08 | 0.32 | 24.32 | 0.55 | 6323.2 | ❖ |
| 14 | 17.2 | 187.49 | 5624.6 | 72.37 | 0.30 | 24.30 | 0.56 | 6323.2 | ❖ |
| 14 | 17.4 | 184.27 | 5528.2 | 73.59 | 0.28 | 24.28 | 0.57 | 6323.2 | ❖ |
| 14 | 17.6 | 181.24 | 5437.3 | 74.76 | 0.26 | 24.26 | 0.58 | 6323.2 | ❖ |
| 14 | 17.8 | 178.38 | 5351.4 | 75.88 | 0.24 | 24.24 | 0.59 | 6323.2 | ❖ |
| 14 | 18.0 | 175.66 | 5269.9 | 76.94 | 0.23 | 24.23 | 0.59 | 6323.2 | ❖ |
| 14 | 18.2 | 173.08 | 5192.5 | 77.97 | 0.21 | 24.21 | 0.59 | 6323.2 | ❖ |
| 14 | 18.4 | 170.63 | 5118.8 | 78.95 | 0.19 | 24.19 | 0.60 | 6323.2 | ❖ |
| 14 | 18.6 | 168.28 | 5048.5 | 79.89 | 0.18 | 24.18 | 0.60 | 6323.2 | ❖ |
| 14 | 18.8 | 166.04 | 4981.3 | 80.80 | 0.16 | 24.16 | 0.60 | 6323.2 | ❖ |
| 14 | 19.0 | 163.90 | 4917.1 | 81.68 | 0.14 | 24.14 | 0.60 | 6323.2 | <-- $R_{min}$ ❖ |

FIG. 5B

ANTI-TOMBSTONING SOLDER JOINTS

BACKGROUND OF THE INVENTION

1. Field of the Invention

The present invention relates generally to electronic circuit assemblies. More particularly, the present invention relates to electronic circuit assemblies having surface mount devices with anti-tombstoning solder joints.

2. Disclosure Information

A typical surface mount device (SMD) is mechanically and electrically attached to a printed circuit board (PCB) substrate by providing mounting pads on the substrate, depositing solder paste onto these pads, placing the SMD on the solder paste/mounting pads such that its terminations are aligned with their respective mounting pads, reflowing the solder through the application of heat, and allowing the solder to cool so as to form a solder joint connecting each termination with its respective mounting pad.

Once the solder paste deposition atop each mounting pad melts, pressure forces and surface tension forces from the molten solder begin acting at the interface between the solder joint outer surface and the SMD, thereby exerting forces and moments upon the SMD. These forces are illustrated in FIG. 1, where $P_1$ and $P_2$ represent the pressure (suction) forces and $F_1$ and $F_2$ represent the surface tension forces acting by the solder joint upon the SMD, and where W represents the weight of the device. It is well known that during the reflow process the solder depositions melt at slightly different times, such that solder joints at one end of the SMD may melt and begin exerting forces on the SMD before solder joints at another end. This uneven application of forces often causes the SMD to undergo two related phenomena known as "tombstoning" and "decentering".

Tombstoning occurs when a net moment is exerted on the SMD by melted solder joints at one end of the device such that the device rotates—first about the device's center of mass, and then about a fulcrum point G, located at the outer edge of the bottom termination adjacent the molten solder joint, when the fulcrum point touches down upon the top surface of the adjacent mounting pad—whereupon the SMD "stands up" on that end. This causes the device to detach from the unmelted or partially melted solder paste at the opposite end. Decentering occurs when a net force is exerted on the device in a direction toward the molten solder joint, thus tending to pull the opposite end of the device off of its unmelted or partially melted solder paste. Device decentering typically occurs before tombstoning does, and it exacerbates the tombstoning problem by detrimentally changing the angles made by $F_1$ and $F_2$ with their respective lever arms. Both tombstoning and decentering can cause the device to be mechanically and electrically disconnected from the mounting pads on the end where the solder paste melted last. As indicated in FIG. 1, forces $P_1$ and $F_1$ contribute toward tombstoning and decentering.

Prior art attempts at addressing the problems of tombstoning and decentering have focused on making the various depositions of solder paste on a PCB melt more simultaneously. However, this is extremely difficult to accomplish with conventional reflow soldering equipment and processes. It is desirable, therefore, to provide a way of reducing tombstoning and decentering which does not rely on making the solder depositions melt more simultaneously.

SUMMARY OF THE INVENTION

The present invention overcomes the disadvantages of the prior art by providing an electronic circuit assembly having anti-tombstoning solder joints comprising: a substrate having at least one mounting pad thereon; an SMD having at least one termination; and at least one solder joint connecting each termination to its respective mounting pad. Each solder joint is convex in shape, having a continuous and substantially circular arcuate outer profile and covering substantially all of the mounting pad and substantially all of a top portion of each termination. Each mounting pad has a predetermined length and each solder joint has a predetermined volume of solder selected such that a positive net anti-tombstoning moment is exerted upon the SMD when at least one solder joint is in a molten state.

It is an advantage that the effectiveness of the present invention does not rely on near-simultaneous melting of the solder depositions on an electronic circuit assembly.

It is another advantage that the present invention reduces tombstoning while providing flexibility in the spacing apart of mounting pads located at opposing ends of the SMD.

These and other advantages, features and objects of the invention will become apparent from the drawings, detailed description and claims which follow.

BRIEF DESCRIPTION OF THE DRAWINGS

FIGS. 5A and 5B are tables of calculation results for a given SMD according to the present invention.

DETAILED DESCRIPTION OF THE PREFERRED EMBODIMENTS

Figure 1:
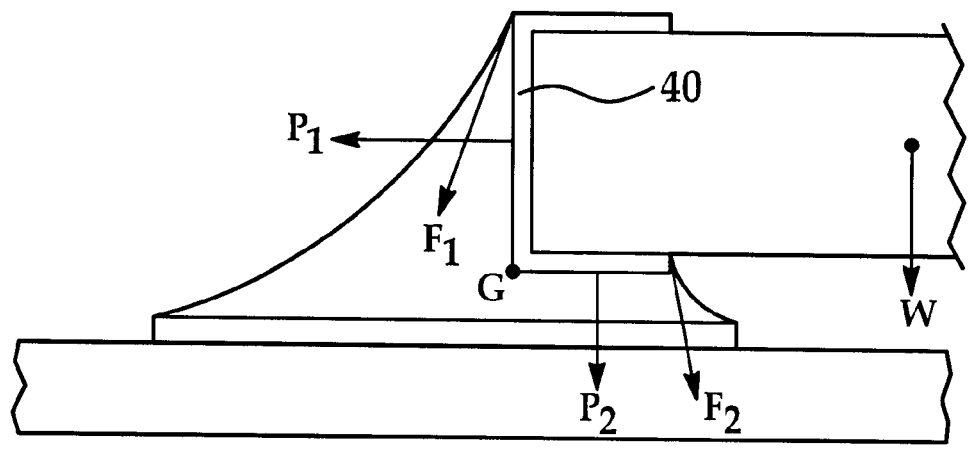
FIG. 1 is an elevational view of a concave prior art solder joint subjected to tombstoning forces.
Figure 2:
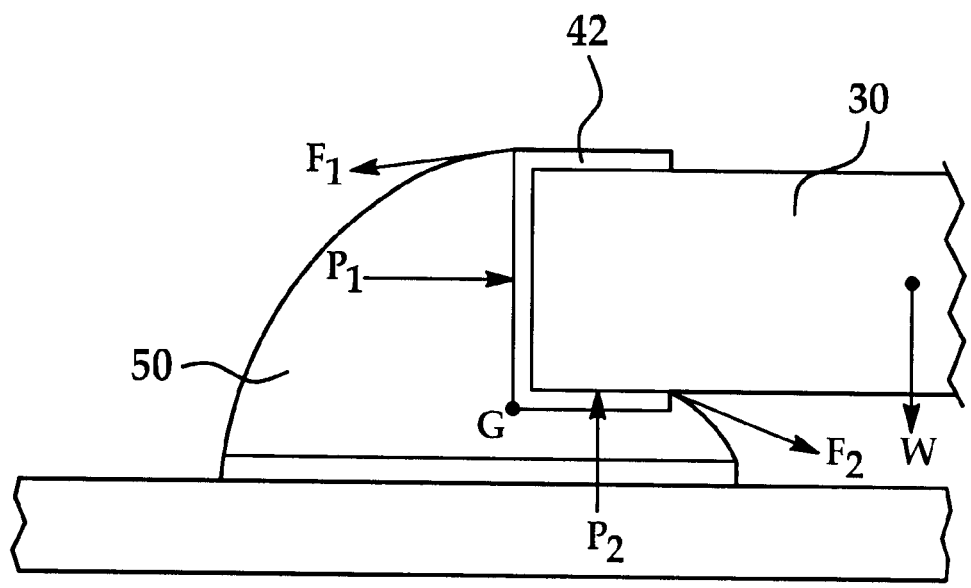
FIG. 2 is an elevational view of a convex prior art solder joint subjected to tombstoning forces.
Figure 3:
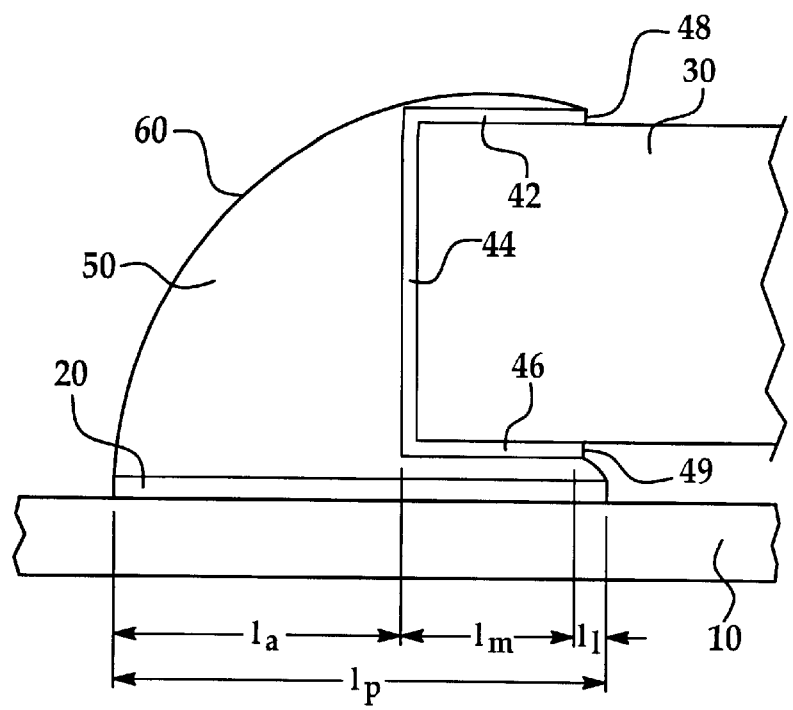
FIG. 3 is an elevational view of an over-the-top anti-tombstoning solder joint according to the present invention.

Referring now to the drawings, FIG. 3 shows an electronic circuit assembly having anti-tombstoning solder joints according to the present invention. The assembly comprises: a substrate 10 having at least one mounting pad 20 thereon, wherein each mounting pad is of a predetermined length $l_p$; an SMD 30 having at least one termination 40, wherein each termination 40 has a top portion 42, a side portion 44, and an optional bottom portion 46; and at least one solder joint 50 connecting each termination 40 to its respective mounting pad 20. Each solder joint 50 has a predetermined volume V of solder and is convex in shape, rather than being concave as conventional solder joints are. The solder joint 50 has a continuous and substantially circular arcuate outer profile 60, and covers substantially all of the respective mounting pad 20 and substantially all of the top and side portions 42/44 of the respective termination 40. For simplicity, this type of solder joint 50 will be referred to hereinafter as an "over-the-top joint", or an "OTTJ".

This type of solder joint structure arranges the pressure forces and surface tension forces in such a way that a positive net anti-tombstoning moment and a positive net recentering force are both exerted on the device 30 by each solder joint 50 when each joint 50 is in a molten state (i.e., after reflow but before cooling of the joint 50).

In order to optimize the design of the solder joint 50 such that an OTTJ is formed and a positive net anti-tombstoning moment and a positive net recentering force are both exerted on the SMD 30 when each solder joint 50 melts, it is necessary to determine the amount of solder to be deposited on each mounting pad 20 in order to form such a joint 50, and to specially design the mounting pad length $l_p$ such that the forces and moments are arranged as desired while each joint is molten.

Figure 4:
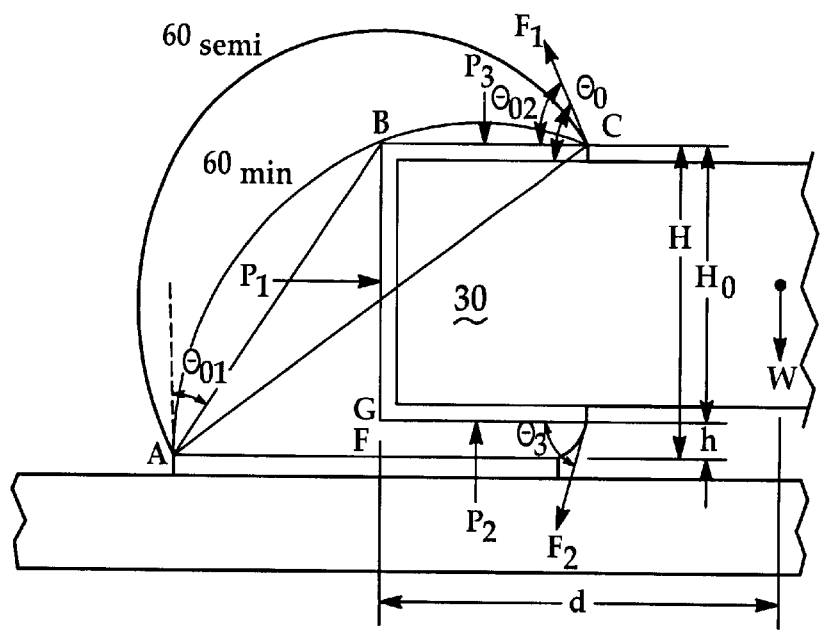
FIG. 4 is a free-body diagram of an SMD and the forces acting thereon according to the present invention when a solder joint is molten and any decentering/recentering have occurred, but before any tombstoning might occur.

These forces and moments can be seen in the free-body diagram of the SMD 30 shown in FIG. 4. This figure shows the forces acting at one termination 40 at a time when the solder joint 50 thereat is molten, but while the solder at any other termination 40 is not yet molten. Typically, when the solder paste at one joint of the device melts, the molten paste may pull (i.e., decenter) the device toward the molten paste. However, once the molten paste forms a convex joint, the outward pressure of the joint against the device will tend to recenter the device. The forces shown in FIG. 4 are those present after any such decentering and recentering may occur, but before any tombstoning might occur. $P_1$, $P_2$, and $P_3$ are the pressure forces acting on the side 44, bottom 46, and top 42 terminations of the device 30, respectively, due to the higher-than-ambient pressure found within a convex solder joint 50. $F_1$ and $F_2$ are the surface tension forces acting on the device 30 at the interior edge 48 of the top termination 42 and on the interior edge 49 of the bottom termination 46, respectively. W is the weight of the device 30 acting at the device's center of gravity located at a distance d from the fulcrum point G about which the device tends to pivot when tombstoning.

Force $P_1$ contributes positively toward recentering the device, while the horizontal components of forces $F_1$ and $F_2$ tend to resist recentering. Forces $P_1$, $P_2$, and W contribute positively toward anti-tombstoning, while $F_1$ tends to resist these forces. (Forces $P_3$ and $P_2$ also contribute somewhat toward and away from anti-tombstoning, respectively, but the moments of these forces are roughly equal and opposite with respect to each other and, therefore, tend to cancel each other for typical components.) Thus, the net horizontal force $\Sigma F_x$ and net moment $\Sigma M_G$ acting on the device due to a single molten joint may be expressed as:

$$\Sigma F_x = P_1 - F_1 \cos \theta_{o2} - F_2 \cos \theta_3 \qquad (1)$$

and $$\Sigma M_G = Wd + P_1(H_o/2) + F_2 l_m \sin \theta_3 - F_1 R_m \sin \theta_{o2} \qquad (2)$$

where $$F_1 = F_2 = \sigma \qquad (3)$$

and $$P_1 = H_o K \Delta P = H_o K[2\sigma \sin \sigma_o / \sqrt{(l_o + l_m)^2 + H^2}] \qquad (4)$$

and $$Rm = \{GC\} = \sqrt{l_m^2 + H_o^2} \qquad (5)$$

where $\Delta P$ is the pressure in the solder joint above ambient (in p.s.i. or N/m$^2$) and K is a correction factor (e.g., 1.5) used to account for the difference between what the actual 3D pressure would be and what the present calculations based on 2D cross-sectional area would provide. Note that a positive net value for $\Sigma F_x$ indicates a beneficial net recentering force, while a positive value for $\Sigma M_G$ indicates a beneficial net anti-tombstoning moment. Thus, it is desired that the solder joint 50 be designed such that a positive value for $\Sigma F_x$ is provided before recentering and a positive value $\Sigma M_G$ is provided after recentering.

The present invention accomplishes this by providing an appropriate design for the mounting pad length $l_p$ and by determining the volume of solder V needed to be deposited on the mounting pad 20 in order to provide an OTTJ which yields the desired forces and moments when the solder joint 50 is molten, as described above. One way of designing an electronic circuit assembly having SMDs which utilize such OTTJs is to follow the iterative design steps given below. (Note that the geometry and forces referred to below are those present at a time when at least one solder joint is molten and after any decentering and recentering have occurred, but before any tombstoning might occur. Thus, the dimensions $l_i$ and $l_o$ refer to the "effective" inner and outer mounting pad extension lengths, respectively, at the just-mentioned point in time, rather than to the "final" inner and outer mounting pad extension lengths as measured when all joints have reflowed and solidified.)

The first step is to determine the criteria for selecting the "best" anti-tombstoning joint design. For example, one criterion might be that for a given SMD, the OTTJ must provide the greatest positive anti-tombstoning moment on the SMD when at least one joint is molten. An alternative criterion might be that the OTTJ must provide the largest window of positive anti-tombstoning moments. An additional criterion might be that the joint design must fit within the given solder deposition or manufacturing constraints. Other predetermined criteria may be used as well.

Second, determine the dimensions and features for each given SMD 30 and for the given solder deposition strategy. These include: W, d, the number of terminations, $H_o$ (the height of each side termination 44), h (the distance between the top of the mounting pad 20 and the underside of the bottom termination 46 (or the bottom of the device, if no bottom termination 46 is present), also known as the solder joint height), $l_m$ (the length of the top and optional bottom terminations 42/46, which are typically of the same length), w (the width of each termination 40), the surface tension $\sigma$, the 3D correction factor K, and the limits of the particular solder deposition strategy to be used (e.g., screen printing with 2 mils maximum overprinting on each side, maximum deposition thickness of 10 mils, using paste having 52% solder).

Third, initially assume the inner pad extension $l_i$ to be of zero length, and select a range within which the outer pad extension length $l_o$ may be iterated. The range should be chosen based on experience, expected available board space, the size of device 30 to be used, etc. For example, for an 0.06-inch×0.03-inch surface mount resistor, a range of 6 to 14 mils might be chosen for $l_o$.

Fourth, for selected $l_o$ values within the selected $l_o$ range (e.g., 6, 7, 8, ... 13, and 14 mils), find the radius of curvature $R_{min}$ which provides the smallest volume of solder $V_{min}$ that will form a convex, continuous, substantially circular arc covering substantially all of the top termination 42 and substantially all of the mounting pad 20 (or, more specifically, substantially all of the outer pad extension 26). Using the solder joint geometry shown in FIG. 4, this radius $R_{min}$ corresponds to the arc $60_{min}$ circumscribing points A, B and C. The following formula may be iteratively solved for $R_{min}$:

$$\cos^{-1}[C_o/(2R_{min})] + \cos^{-1}[l_m/(2R_{min})] = \tan^{-1}(l_o/H) + \pi/2 \qquad (6)$$

where $$H = H_o + h \qquad (7)$$

and $$C_o = \{AB\} = \sqrt{H^2 + l_o^2}. \tag{8}$$

Fifth, for each $l_o$, calculate the approximate cross-sectional area $A_{min}$ and volume $V_{min}$ of the solder joint 50 corresponding to $R_{min}$, using:

$$A_{min} = (\theta_{01} + \theta_{02})R_{min}^2 - 0.5R(C_o \cos \theta_{01} + l_m \cos \theta_{02}) + 0.5Hl_o + hl_m \tag{9}$$

and $$V_{min} = wA_{min} \tag{10}$$

where $$\theta_{01} = \sin^{-1}[C_o/(2R_{min})] \tag{11}$$

and $$\theta 02 = \sin^{-1}[H/(2R_{min})]. \tag{12}$$

Sixth, set the sum of the horizontal forces $\Sigma F_x$ acting on the SMD 30 to zero (corresponding to the case occurring in the molten joint after any recentering has occurred, but before any tombstoning would occur) and solve the equation for $\theta_{03}$:

$$\Sigma F_x = 0 = P_1 - F_1 \cos \theta_{02} - F_2 \cos \theta_3, \tag{1}$$

yielding $$\theta_3 = \cos^{-1}[(P_1 - F_1 \cos \theta_{02})/F_2]. \tag{13}$$

Seventh, once $\theta_3$ is known, the inner pad length $l_i$, total mounting pad length $l_p$, and the sum of the moments about the fulcrum point G $\Sigma M_G$ may be calculated, using:

$$l_i = h \cos \theta_3 \tag{14}$$

and $$l_p = l_o + l_m + l_i \tag{15}$$

and $$\Sigma M_G = Wd + P_1(H_o/2) + F_2 l_m \sin \theta_3 - F_1 R_m \sin \theta_0^2. \tag{2}$$

Eighth, for each selected $l_o$, increment the radius R through several iterations such that the corresponding solder joint cross-sectional area A and volume V increase, and repeat the area, volume, and moment calculations for these incremented R values. R may be incrementally decreased from $R_{min}$ down to a value $R_{semi}$ corresponding to the semi-circular arc $60_{semi}$ spanning between points A and C, where $$R_{semi} = \{AC\}/2 = \sqrt{(l_o + l_m)^2 + H^2}. \tag{16}$$

As the value of R is further iterated such that A and V continue to increase, F will begin increasing above the $R_{semi}$ value. (Note, however, that in practice as R increases beyond $R_{semi}$, there may be a tendency for the joint to form solder balls. Therefore, one may choose to limit the design such that R falls only between $R_{min}$ and $R_{semi}$.) For each iterated R value, A, V, $\theta_3$, $l_i$, $l_p$, and $\Sigma M_G$ may be calculated using:

$$A = R^2 \sin^{-1}[R_{semi}/(2R)] - (l_m^2/2)[H/(l_o + l_m)] - (R_{semi}/2)\sqrt{R^2 - R_{semi}^2/4} + Hl_o^2/[2(l_o + l_m)] + hl_m \tag{17}$$

and $$V = wA \tag{18}$$

and $$\theta_3 = \cos^{-1}[(P_1 - F_1 \cos \theta_{02})/F_2]. \tag{13}$$

and $$l_i = h \cos \theta_3 \tag{14}$$

and $$l_p = l_o + l_m + l_i \tag{15}$$

and $$\Sigma M_G = Wd + P_1(H_o/2) + F_2 l_m \sin \theta_3 - F_1 R_m \sin \theta_0^2. \tag{2}$$

It may be noted that in the above area calculations (i.e., Eqns. (9) and (17)), $l_i$ was assumed to be of zero length. This was done for simplicity in order to approximate the solder joint area underneath the bottom termination as being rectangular (i.e., $hl_m$), since this area contributes only negligibly to the overall solder joint cross-sectional area A. However, in Eqns. (1), (2), and (13)–(15), $l_i$ is not assumed to be zero, because although $l_i$ is generally very small (on the order of 0.5 mil) it is critical to know the angle $\theta_3$ formed between force vector $F_2$ and the horizontal in order to properly calculate $\Sigma M_G$ and $l_p$.

Ninth, once all of the calculations have been made for the desired range of $l_o$ values (and for the range of incremented R values corresponding to each $l_o$), the calculation results from the above steps may be organized in a table or spreadsheet such as that shown in FIGS. 5A–5B, and the mounting pad length $l_p$ and volume V combination which meets the predetermined selection criteria may be selected as the targeted anti-tombstoning OTTJ design. For example, using the SMD values in FIGS. 5A–5B, if the selection criterion were that the OTTJ must provide the greatest positive anti-tombstoning moment on the SMD, then $l_p$ and V values of approximately 21.36 mils and 4067.8 mil$^3$, respectively, would be utilized, since this combination offers the highest positive anti-tombstoning moment (i.e., 0.94 N·mils). Alternatively, if the selection criterion were that the OTTJ must provide the largest range of positive anti-tombstoning moments, then it appears from FIG. 5 that a combination of either (1) $23.21 \leq lp \leq 23.53$ and $4613.1 \leq V \leq 6102.1$, or (2) $24.14 \leq lp \leq 24.42$ and $4917.1 \leq V \leq 6216.5$, meets this criterion. In such a case, a designer might choose a value for $l_p$ and its associated V somewhere in the middle of these ranges as the targeted values for these features.

By re-arranging the foregoing equations and looking to the geometries disclosed in FIGS. 3–4, the volume V and pad length $l_p$ combinations which provide a positive net anti-tombstoning moment may be expressed as a range of R values, where R is the radius of curvature of the substantially circular arcuate outer profile 60 as viewed at a generally centerline cross-section of the device. This range for R may be expressed as:

$$0.5[(l_o + l_m)^2 + H^2]^{1/2} < R < \frac{(H^2 + l_o^2)^{1/2} + l_m}{1.88(\pi/2 - \tan^{-1}\{l_o/H\})}. \tag{19}$$

Likewise, one may also re-arrange the foregoing equations to arrive at ranges for $l_o$ and $l_p$ which provide solutions yielding positive anti-tombstoning moments, such as:

$$0.7H_o < l_o < 1.4H_o, \tag{20}$$

$$0.65H < l_o < 1.3H, \tag{21}$$

$$(0.8H_o+l_m)<l_p<(1.5H_o+l_m), \quad (22)$$

and $$(0.75H+l_m)<l_p<(1.4H+l_m). \quad (23)$$

The foregoing design steps address the case of a single molten solder joint. In the case of an SMD having only one termination, or an SMD having two opposing, equally sized terminations, as well as some other cases, no further calculations need be done in order to design an OTTJ according to the present invention. However, for SMDs having three or more terminations, or two terminations both on the same side of the device, as well as other cases, additional calculations need to be done. These additional calculations would be necessary because the foregoing steps cover the case of only one molten joint, while the presently-mentioned types of SMDs may have two or more joints molten at any given time which might contribute toward tombstoning. For such devices, the same type of analysis as given above is conducted, but with a modified version of the foregoing equations adapted to include all of the forces and moments acting on the device due to the two or more molten (and potentially tombstoning) solder joints.

One consideration that should be kept in mind is that it may not be possible to actually produce some of the iterated configurations given the solder deposition or other practical constraints a designer might face. For example, those lines in FIGS. 5A–5B which have "#NUM!" (indicating a spreadsheet calculation error) in the $\theta_3$, $l_i$, $l_p$, and $\Sigma M_G$ columns represent iterations which are physically impossible to produce. Also, it may not be possible for a given solder deposition strategy to deposit enough solder paste to achieve the calculated solder volume V for some of the iterated configurations. (Note that the "Max. Paste" for the given deposition strategy has been estimated for each $l_o$, where Max. Paste equals the product of: (1) the deposition thickness T; (2) the percent of solder in the solder paste $S_\%$; (3) the pad length (approximated here as $l_o+l_m$) plus the maximum overprinting length beyond each pad $O_L$; and (4) the width w of the pad plus the maximum overprinting on the two sides of the pad $O_s$.) Note that in FIGS. 5A–5B all iterations in which $\Sigma M_G \geq 0$ and V≦Max. Paste have been marked with a diamond to denote those iterations which are both producible and anti-tombstoning. It can thus be seen that any such solder deposition, manufacturing, and/or other practical constraints should be included as part of the selection criteria.

Once the designer has determined the optimum combination of mounting pad length $l_p$ and solder joint volume V which provide an anti-tombstoning OTTJ and which meet the predetermined selection criteria, the designer has some flexibility in determining the spacing to be used between mounting pads placed at opposite ends of the device. This flexibility exists because the success of the present invention does not rely upon the spacing between opposite mounting pads. This is due to the fact that the force balance on the device provided by the present invention after all joints have melted tends to leave the part substantially centered with respect to the mounting pads.

One design option that would minimize decentering and recentering during reflow is to space the mounting pads such that when the SMD is placed thereon, the same SMD-to-mounting pad orientation is achieved as would be found when at least one solder deposition is molten. In other words, the placement of the pads and SMD are such that when one joint is molten, the SMD will already be positioned on the pads so as to achieve horizontal force equilibrium, thus requiring no decentering and/or recentering of the device. Thus, once $l_p$ is determined as discussed above, the mounting pads may be spaced such that the interior edge 24 of their inner pad extensions 22 are substantially flush with the interior edge 48 of their respective bottom terminations 46, since the calculated $l_i$ value is generally so small.

Various other modifications to the present invention will, no doubt, occur to those skilled in the art to which the present invention pertains. For example, although FIGS. 3 and 4 show the SMD's terminations 40 comprising contiguous top, side, and bottom portions, with the top and bottom portions being substantially equal in length (which is typical of many SMDs), it is not necessary that each termination have a bottom portion 46, nor that the side portion 44 extend down the full height of the device, nor that the top and bottom portions be equal in length. It is the following claims, including all equivalents, which define the scope of the invention.

What is claimed is:

1. An electronic circuit assembly having anti-tombstoning solder joints, comprising:

a substrate having at least one mounting pad thereon, wherein each mounting pad has an overall length $l_p$;

a surface mount device having at least one termination, wherein each termination has a top portion and a side portion, wherein each top portion has a length $l_m$ and each side portion has a height $H_o$; and at least one solder joint connecting each termination to a respective mounting pad such that a top surface of said top portion is disposed at a height H above a top surface of said mounting pad;

wherein each solder joint is convex in shape, having a continuous and substantially circular arcuate outer profile, wherein each solder joint covers substantially all of said mounting pad and substantially all of said top and side portions of said termination, wherein an outer pad portion of said mounting pad extends outward from said device by a length $l_o$, and wherein said substantially circular arcuate outer profile has a radius of curvature R as viewed at a generally centerline cross-section of said device, such that:

$$0.5[(l_o+l_m)^2+H^2]^{1/2} < R < \frac{(H^2+l_o^2)^{1/2}+l_m}{1.88(\pi/2-\tan^{-1}\{l_o/H\})}.$$

2. An electronic circuit assembly according to claim 1, wherein a positive net anti-tombstoning moment is exerted upon said surface mount device when at least one solder joint is in a molten state.

3. An electronic circuit assembly according to claim 1, wherein $l_p$ and R are selected according to a predetermined selection criterion.

4. An electronic circuit assembly according to claim 3, wherein said predetermined selection criterion is that each anti-tombstoning solder joint provides a maximum positive anti-tombstoning moment on said surface mount device when at least one solder joint is molten.

5. An electronic circuit assembly according to claim 3, wherein said predetermined selection criterion is that each anti-tombstoning solder joint provides a largest window of positive anti-tombstoning moments on said surface mount device when at least one solder joint is molten.

6. An electronic circuit assembly according to claim 1, wherein said surface mount device is an electronic component having three or more terminations.

7. An electronic circuit assembly according to claim 1, wherein said surface mount device is an electronic component having two opposing terminations.

8. An electronic circuit assembly according to claim 1, wherein each termination further includes a bottom portion, and wherein an interior edge of an inner pad extension of each mounting pad is substantially flush with a respective termination bottom portion interior edge.

9. An electronic circuit assembly according to claim 1, wherein $0.7H_o<l_o<1.4H_o$.

10. An electronic circuit assembly accorcing to claim 1, wherein $0.65H<l_o<1.3H$.

11. An electronic circuit assembly according to claim 1, wherein $(0.8H_o+l_m)<l_p<(1.5H_o+l_m)$.

12. An electronic circuit assembly according to claim 1, wherein $(0.75H+l_m)<l_p<(1.4H+l_m)$.

13. An electronic circuit assembly having anti-tombstoning solder joints, comprising:

a substrate having at least one mounting pad thereon, wherein each mounting pad has an overall length $l_p$;

a surface mount device having at least one termination, wherein each termination has a top portion and a side portion, wherein each top portion has a length $l_m$ and each side portion has a height $H_o$; and at least one solder joint connecting each termination to a respective mounting pad such that a top surface of said top portion is disposed at a height H above a top surface of said mounting pad;

wherein each solder joint is convex in shape, having a continuous and substantially circular arcuate outer profile, wherein each solder joint covers substantially all of said mounting pad and substantially all of said top and side portions of said termination, wherein an outer pad portion of said mounting pad extends outward from said device by a length $l_o$, and wherein said substantially circular arcuate outer profile has a radius of curvature R as viewed at a generally centerline cross-section of said device, such that:

$$0.5[(l_o+l_m)^2+H^2]^{1/2}<R<\frac{(H^2+l_o^2)^{1/2}+l_m}{1.88(\pi/2-\tan^{-1}\{l_o/H\})},$$

such that a positive net anti-tombstoning moment is exerted upon said surface mount device when at least one solder joint is in a molten state.

14. An electronic circuit assembly according to claim 13, wherein $l_p$ and R are selected according to a predetermined selection criterion.

15. An electronic circuit assembly according to claim 14, wherein said predetermined selection criterion is that each anti-tombstoning solder joint provides a maximum positive anti-tombstoning moment on said surface mount device when at least one solder joint is molten.

16. An electronic circuit assembly according to claim 14, wherein said predetermined selection criterion is that each anti-tombstoning solder joint provides a largest window of positive anti-tombstoning moments on said surface mount device when at least one solder joint is molten.

17. An electronic circuit assembly according to claim 13, wherein said surface mount device is an electronic component having three or more terminations.

18. An electronic circuit assembly according to claim 13, wherein said surface mount device is an electronic component having two opposing terminations.

19. An electronic circuit assembly according to claim 13, wherein each termination further includes a bottom portion, and wherein an interior edge of an inner pad extension of each mounting pad is substantially flush with a respective termination bottom portion interior edge.

20. An electronic circuit assembly according to claim 13, wherein $0.7H_o<l_o<1.4H_o$.

21. An electronic circuit assembly according to claim 13, wherein $0.65H<l_o<1.3H$.

22. An electronic circuit assembly according to claim 13, wherein $(0.8H_o+l_m)<l_p<(1.5H_o+l_m)$.

23. An electronic circuit assembly according to claim 13, wherein $(0.75H+l_m)<l_p<(1.4H+l_m)$.

24. An electronic circuit assembly having anti-tombstoning solder joints, comprising:

a substrate having at least one mounting pad thereon, wherein each mounting pad has an overall length $l_p$;

a surface mount device having at least one termination, wherein each termination has a top portion, a side portion, and a bottom portion, wherein each bottom portion has a length $l_m$ and each side portion has a height $H_o$; and at least one solder joint connecting each termination to a respective mounting pad such that a top surface of said top portion is disposed at a height H above a top surface of said mounting pad;

wherein each solder joint is convex in shape, having a continuous and substantially circular arcuate outer profile, wherein each solder joint covers substantially all of said mounting pad and substantially all of said top and side portions of said termination, wherein an outer pad portion of said mounting pad extends outward from said device by a length $l_o$, and wherein said substantially circular arcuate outer profile has a radius of curvature R as viewed at a generally centerline cross-section of said device, such that:

$$0.5[(l_o+l_m)^2+H^2]^{1/2}<R<\frac{(H^2+l_o^2)^{1/2}+l_m}{1.88(\pi/2-\tan^{-1}\{l_o/H\})},$$

wherein an interior edge of an inner pad extension of each mounting pad is substantially flush with a respective termination bottom portion interior edge.

25. An electronic circuit assembly according to claim 24, wherein a positive net anti-tombstoning moment is exerted upon said surface mount device when at least one solder joint is in a molten state.

26. An electronic circuit assembly according to claim 24, wherein $l_p$ and R are selected according to a predetermined selection criterion.

27. An electronic circuit assembly according to claim 24, wherein said surface mount device is an electronic component having three or more terminations.

28. An electronic circuit assembly according to claim 24, wherein said surface mount device is an electronic component having two opposing terminations.

29. An electronic circuit assembly according to claim 24, wherein $0.7H_o<l_o<1.4H$.

30. An electronic circuit assembly according to claim 24, wherein $0.65H<l_o<1.3H_o$.

31. An electronic circuit assembly according to claim 24, wherein $(0.8H_o+l_m)<l_p<(1.5H_o+l_m)$.

32. An electronic circuit assembly according to claim 24, wherein $(0.75H+l_m)<l_p<(1.4H+l_m)$.

* * * * *